United States Patent [19]

Pimpinella et al.

[11] Patent Number: 4,926,545

[45] Date of Patent: May 22, 1990

[54] METHOD OF MANUFACTURING OPTICAL ASSEMBLIES

[75] Inventors: Richard J. Pimpinella, Hampton; John M. Segelken, Morristown, both of N.J.

[73] Assignee: AT&T Bell Laboratories, Murray Hill, N.J.

[21] Appl. No.: 353,264

[22] Filed: May 17, 1989

[51] Int. Cl.$^5$ .............................................. H05K 3/30
[52] U.S. Cl. ...................... 29/832; 174/52.4; 350/96.17; 357/19; 357/81
[58] Field of Search ................... 174/52.4; 357/81, 19; 350/96.11, 96.17; 29/832; 428/901

[56] References Cited

U.S. PATENT DOCUMENTS

| | | | |
|---|---|---|---|
| 3,879,606 | 4/1975 | Bean | 350/96.17 X |
| 4,040,078 | 8/1977 | Eckton, Jr. et al. | 357/19 X |
| 4,633,582 | 1/1987 | Ching et al. | 174/52.4 X |
| 4,733,932 | 3/1988 | Frenkel et al. | 357/81 X |
| 4,755,017 | 7/1988 | Kapany | 350/96.17 X |

Primary Examiner—Carl J. Arbes
Attorney, Agent, or Firm—Martin I. Finston

[57] ABSTRACT

A new method for fabricating optical assemblies (OAs), which achieves increased throughput and reduced unit cost by mass producing optical subassemblies (OSAs), is disclosed. In accordance with this method, at least two OSAs are simultaneously produced by initially forming at least two corresponding sets of electrically conductive regions on the surface of a substrate. At least two optoelectronic devices are mounted on the surface of the substrate, with each device in electrical contact with one of the two conductor sets. Afterward, the substrate is separated into at least two parts, with each part including one of the optoelectronic devices and one of the conductor sets, constituting an OSA. Each OSA is then incorporated into an OA.

9 Claims, 9 Drawing Sheets

FIG. 4
FIG. 4A
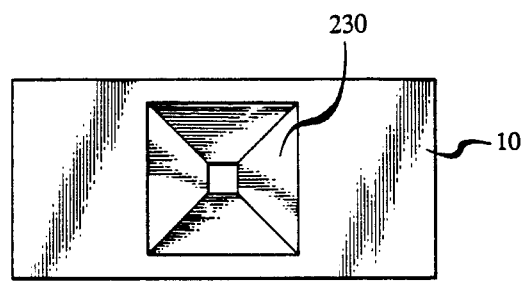
FIG. 4B
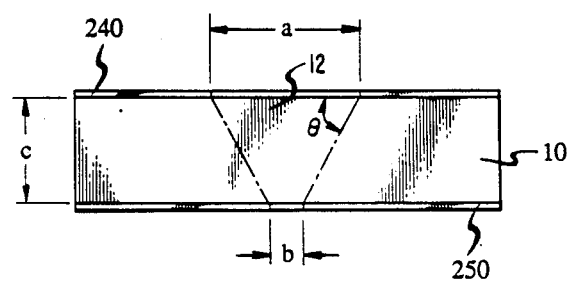

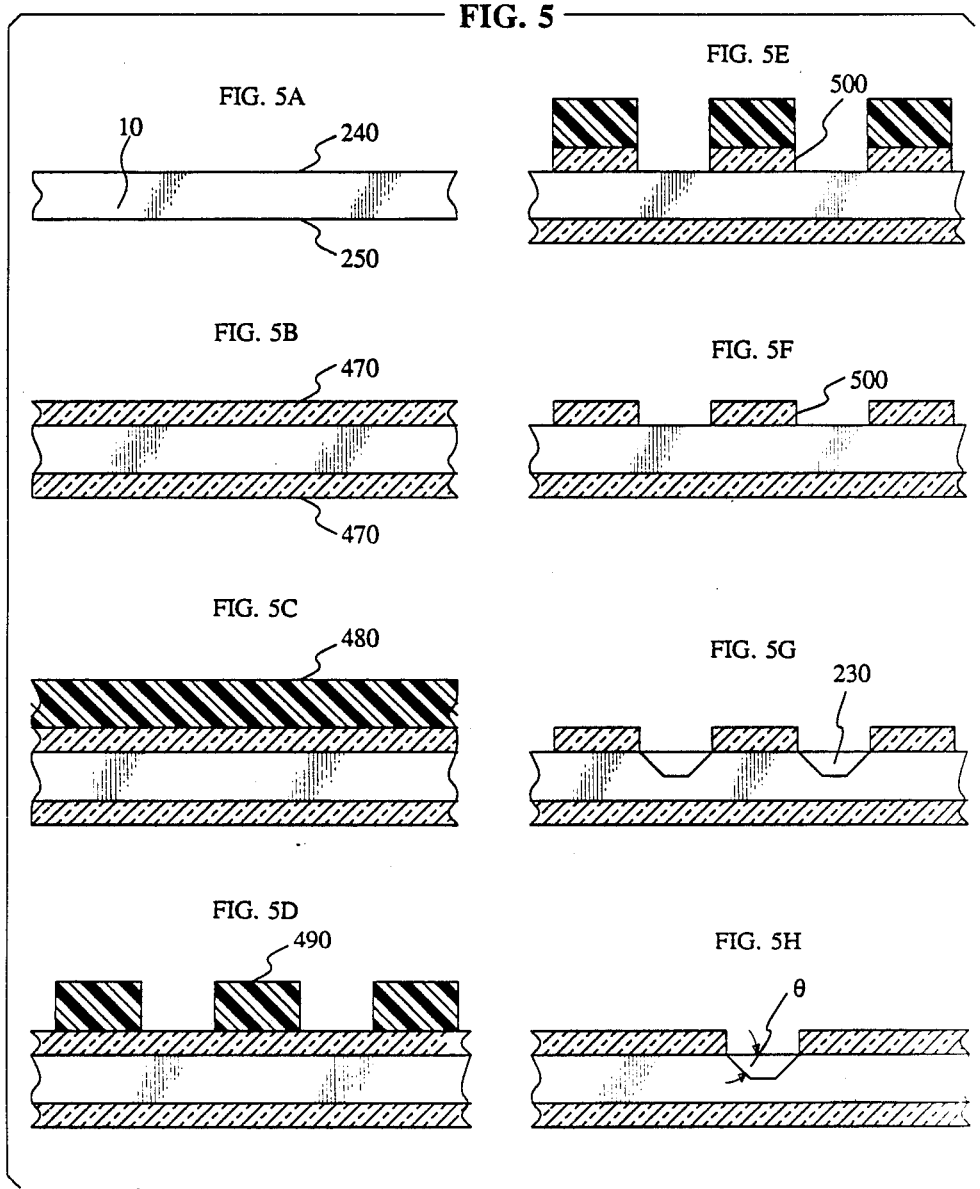

FIG. 7
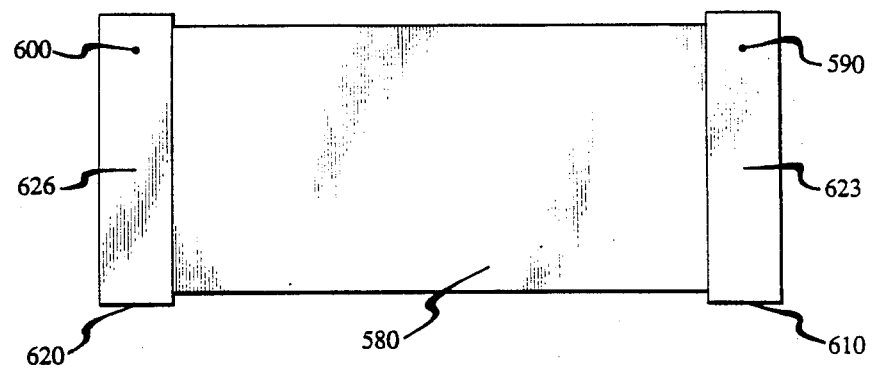
FIG. 7A
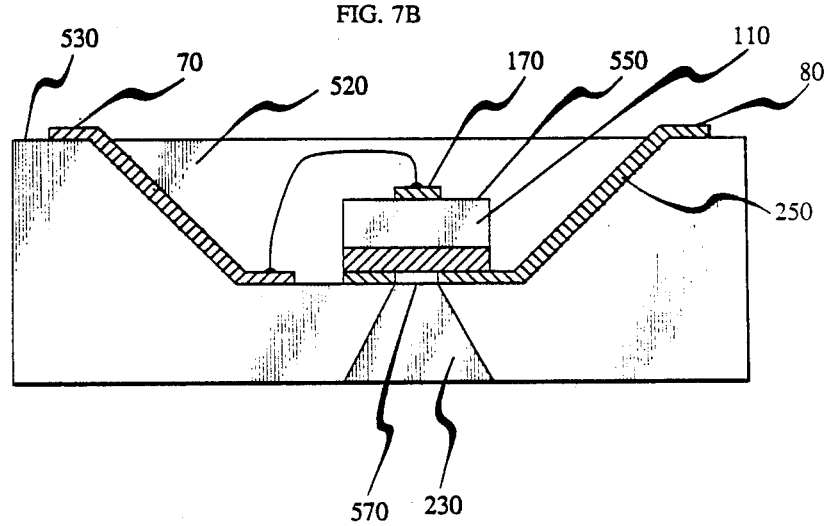
FIG. 7B

METHOD OF MANUFACTURING OPTICAL ASSEMBLIES

BACKGROUND OF THE INVENTION

1. Field of the Invention

The invention pertains to methods for manufacturing articles, called optical assemblies, which comprise optoelectronic devices (such as LEDs or PIN diodes) and are adapted for attachment to lightwave channels, such as optical fibers, for efficiently coupling light into or out of the optoelectronic devices.

2. Art Background

In optical communication systems, a variety of devices, conventionally called optoelectronic devices, are used to convert electrical signals into corresponding optical signals, and vice versa. Included among these optoelectronic devices are semiconductor diode lasers and light emitting diodes (LEDs), used to convert electrical signals into optical signals, and PIN diodes, used to detect optical signals and convert them into electrical signals.

In use, an optoelectronic device is typically incorporated into an apparatus called an optical subassembly (OSA) which, in turn, is incorporated into an apparatus called an optical assembly (OA). That is, an OSA conventionally includes an optoelectronic device mounted upon a support member. The OA includes the OSA and often also includes a circuit board on which the support member is mounted, as well as, in many instances, additional electronic devices mounted, for example, on the support member or on the circuit board. The OA often further includes a housing within which the OA and circuit board are fully or partially enclosed.

The OA is adapted to be connected to a lightwave channel, such as an optical fiber or an optical connector, for efficiently coupling light into or out of the optoelectronic device. To achieve such coupling, the OA typically (although not necessarily) includes a receptacle for receiving the connector or the end of the optical fiber nearest the optoelectronic device. When used, the receptacle is, for example, either mounted on or formed in the support member of the OSA, or, more typically, is mounted on a separate support member.

Significantly, although the optoelectronic devices and the component piece parts of OSAs and OAs are typically mass produced, the OSAs and OAs themselves are conventionally individually manually fabricated and/or assembled, one at a time. That is, each OSA is currently individually fabricated by forming a pattern of strip-like metallic conductors extending between metallic contacts, using conventional silk-screen processing, on the surface of an individual, typically a molded ceramic, support member. An optoelectronic device is manually mounted on the support member by soldering the electrical contacts of the optoelectronic device to certain of the metallic contacts on the support member (electrical communication thus being achievable with the optoelectronic device via other metallic contacts on the support member which are electrically connected to the mounting contacts through the strip-like conductors). Then, the OSA, i.e., the support member bearing the optoelectronic device, and the support member bearing the receptacle for the optical fiber or connector are manually installed in the OA.

After installation, but before the corresponding support members are permanently fixed in relation to one another, the optoelectronic device and lightwave channel are actively aligned, to optimize the coupling of light between the former and the latter. During active alignment, the optoelectronic device is operated, and either the support member bearing the optoelectronic device or the support member bearing the lightwave channel is moved while the output of the optoelectronic device (i.e., the electrical output or the light emanating from, for example, the distal end of the optical fiber) is monitored until an acceptable output is achieved. Once acceptable alignment is attained, the support members are fixed in position, typically by soldering or adhesive attachment. Alternatively, if the lightwave channel is, for example, an optical fiber end is initially held loosely enough within its receptacle to permit moving the fiber to achieve the desired alignment. If so, then after alignment the fiber is secured, for example, with epoxy adhesive.

A significant drawback associated with the current method of individually fabricating OSAs and OAs is the need for manual piece-part handling, which is expensive and limits throughput. In this regard, it has been suggested (although no concrete proposals have ever been formulated) that the cost of manufacturing OAs might be reduced, and throughput increased, if mass production methods could be used to reduce or eliminate the relatively expensive manual handling steps.

Yet another drawback of the current OA fabrication method is the need for active alignment, which also reduces throughput and also increases manufacturing costs. In this regard, as noted, the support member of an OA is conventionally a ceramic part typically processed using conventional fabrication techniques. Significantly, conventional fabrication tolerances are no better than about 100 micrometers. However, single-mode optical fibers must be aligned with optoelectronic devices such as semiconductor lasers or LEDs to within tolerances of less than one micrometer, and multi-mode fibers must be aligned to within tolerances of less than eight micrometers. Because conventional machining is incapable of achieving such tolerances, conventional OAs must necessarily be actively aligned to the optical fibers or connectors to which they are mated. In this regard, it is believed that significant reductions in manufacturing cost could be achieved, at least for multi-mode fiber coupling, if, for example, alignment features for positioning the fiber could be made accurately enough to eliminate the need for active alignment. Even if active alignment were still required, very precise alignment features would still simplify the active alignment step by providing an initial coarse alignment.

Still another drawback of the conventional OA fabrication method is the use of silk-screen processing, which is incapable of forming conductors with precisely controlled dimensions. Consequently, some OAs manufactured by conventional methods suffer undesirably high capacitance due to excessive conductor dimensions, which limits the speed of operation and/or reduces the sensitivity of the corresponding optoelectronic devices.

In some instances, the conventional OA fabrication method involves other production processes that add cost and reduce throughput. For example, for certain optoelectronic devices, e.g., some LEDs, it is common practice, prior to incorporation into OSAs and OAs, to operate the devices for a predetermined period of time at an elevated temperature, to induce failure in those that are defective. This procedure is referred to as "burn-in." Groups of optoelectronic devices are conventionally burned in by repetitiously placing individual devices, one-by-one, on a test rack, and operating the devices. Introduction of an appropriate mass-handling technique could reduce the cost of mass burn-in and mass testing by eliminating repetitious steps.

U.S. Pat. No. 4,779,946 and U.S. Pat. No. 4,826,272 describe a method for fabricating OAs in which silicon, rather than ceramic, support members are employed. In accordance with the teachings of these patents, a plurality of these silicon support members are simultaneously fabricated by initially lithographically patterning a silicon substrate. The patterned silicon substrate is then subdivided into individual members, and individual optoelectronic devices are mounted on the individual support members to form OSAs, which are incorporated into OAs. While this patented method does achieve increased throughput, still higher throughputs are needed, as discussed below.

Until recently, the main application envisioned for OAs has been in long-distance communication. This application has generated a relatively small demand for OAs, typically several thousand per year. Although the manufacture of an OA requires relatively intensive use of manual labor, the manufacturing cost has been tolerated because the demand for OAs has, until now, been relatively small.

Significantly, optical communication links are currently being considered for short-haul communication. This application is expected to generate a much greater demand for OAs, typically several million per year. In order to fill a demand of this magnitude and still keep the application economically feasible, it is advantageous to decrease the manufacturing cost of OAs and increase the throughput by a significant factor. Consequently, practitioners in the art of OA manufacturing have sought a manufacturing method that achieves both a substantial reduction in cost and a substantial increase in throughput.

SUMMARY OF THE INVENTION

The invention involves a method for manufacturing OAs which achieves reduced unit cost and increased throughput by mass producing OSAs. In accordance with this method, at least two OSAs are simultaneously produced by initially forming at least two corresponding sets of electric conductors on the surface of a substrate, such as a silicon wafer covered by a layer of electrically insulating material, e.g., silicon dioxide. This is readily achieved using, for example, conventional lithographic techniques. Then, at least two optoelectronic devices (corresponding to the OSAs) are mounted on the surface of the substrate, with each device in electrical contact with one of the two conductor sets. Afterward, the substrate is separated into at least two parts, with each part including one of the optoelectronic devices and one of the conductor sets, constituting an OSA. Each OSA is then incorporated into an OA using, for example, conventional techniques.

One advantage of the inventive method is that many manual handling steps are eliminated. For example, the electric conductors for the at least two optoelectronic devices are simultaneously formed, in a single step, on a single substrate. In addition, during the mounting process, only a single substrate, rather than many individual support members, is handled. Furthermore, the inventive method is readily automated. By way of example, in an automated assembly process, the single substrate is readily fastened to a holder which is automatically advanced, incrementally, to a new position each time an optoelectronic device is to be mounted, thereby eliminating all manual operations.

The inventive method offers still further advantages. For example, in certain applications it is advantageous to form alignment features on the substrate. Such alignment features include, for example, metallization patterns on, or features etched into, the substrate. In either case, the alignment features for two or more OSAs are readily formed simultaneously, during the lithographic processing of the substrate, using standard lithographic techniques. Significantly, these alignment features, in many instances, eliminate the need for actively aligning the lightwave channel with the optoelectronic device.

Yet another advantage of the inventive method is the ability to simultaneously test multiple mounted optoelectronic devices, in order to detect faulty devices, before the substrate is separated into its constituent parts. That is, the electric conductors are readily formed in a pattern which electrically connects at least some of the optoelectronic devices in a test circuit. When electric current is made to flow in the test circuit, all the interconnected optoelectronic devices are operated, and thus readily tested. Alternatively, standard electrical probing equipment can advance, incrementally, across the substrate, testing individual sites on OSAs.

BRIEF DESCRIPTION OF THE DRAWINGS

The invention is described with reference to the accompanying drawings, wherein:

FIGS. 1a–1c depict, in schematic cross section, various stages in the inventive fabrication method;

FIG. 1d is a schematic top view of the conductor pattern shown in FIG. 1a;

FIGS. 4a and 4b include, respectively, a top view and side view of a portion of a substrate including an exemplary capture cavity for receiving the end of an optical fiber;

FIGS. 5a–5h depict, in schematic side views, progressive stages in the formation of etched cavities in a substrate;

FIGS. 7–9 are, respectively, a schematic cross sectional view of a portion of a substrate containing etched cavities and wells, a corresponding top view and a corresponding bottom view;

DETAILED DESCRIPTION

Figure 1:
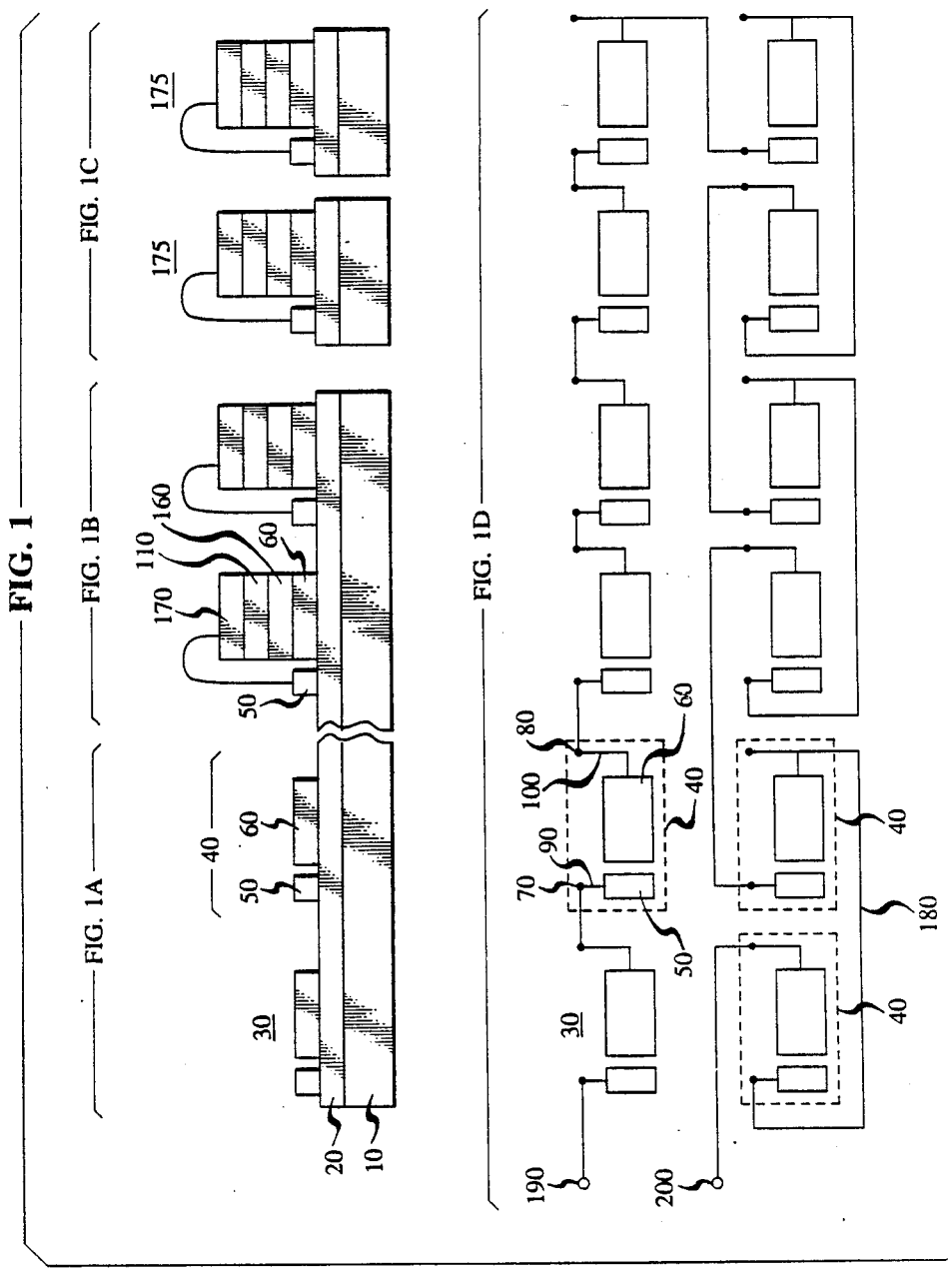

With reference to FIGS. 1a–1d, an OA is manufactured, in accordance with the invention, by simultaneously forming at least two, and preferably hundreds, of OSAs in a substrate 10 (see FIG. 1a). To avoid short-circuiting the electric conductors (described below) associated with each OSA, either the entire substrate 10 should be electrically insulating, or the substrate should include a layer 20 (see FIG. 1a) of electrically insulating material. For example, if the bulk of the substrate 10 is of silicon having a resistivity less than about $10^{15}$ ohm-cm, as is preferred, then the substrate should include a layer 20 of electrically insulating material, such as silicon dioxide or polyimide. The layer of silicon dioxide is readily grown on the silicon using conventional thermal oxidation techniques, or is readily deposited using, for example, plasma-assisted chemical vapor deposition techniques. The layer of polyimide is readily formed by dissolving a polyamic acid in an organic solvent, spin depositing the resulting solution onto the silicon, and then heating the solution to evaporate the solvent and produce imidization. Significantly, the thickness of the layer 20 ranges from about 1 to about 20 micrometers. Thicknesses less than about 1 micrometer are undesirable because the small separation between the substrate and metal conductors deposited on the insulating layer results in undesirable capacitance, and because smaller thicknesses increase the probability that pinhole defects will occur, causing short circuits. On the other hand, thicknesses greater than about 20 micrometers are undesirable because cracking of the insulating layer can occur at such large thicknesses, and in addition, stress in the films can cause the films to peel away from the substrate.

The at least two, and preferably hundreds of, OSAs are manufactured by first forming a pattern 30 (see FIG. 1a and 1d) of electric conductors, e.g., metallic conductors, on the surface of the substrate 10 using, for example, conventional metal deposition and lithographic patterning techniques. (For purposes of the invention, electrically conductive means having an electrical resistivity less than about 100 ohm-cm.) The conductor pattern includes a conductor unit 40 for each OSA, and thus comprises at least two, and preferably hundreds of, conductor units 40. Significantly, as noted above, after the conductor pattern 30 is formed, but before the substrate 10 is subdivided, an optoelectronic device is mounted on, and electrically connected to, each conductor unit 40.

Assuming the optoelectronic device to be mounted has two terminals, as is conventional, then each conductor unit 40 should include a first pair of electrical contacts, to which the terminals of the optoelectronic device are to be electrically connected, e.g., soldered or wirebonded. To achieve electrical communication between the mounted optoelectronic device and other electronic components or external circuitry, the first pair of contacts must be electrically connected to a second pair of electrical contacts which are, in turn, to be electrically connected (via soldering or wirebonding) to the other electronic components or external circuitry. In this regard, each conductor unit 40 should also include at least one strip-like electric conductor, e.g., a strip-like metallic conductor, through which one of the first pair of contacts is electrically connected to a corresponding one of the second pair of contacts. While the remaining contacts are also usefully electrically connected by a second strip-like conductor, these contacts are, in many instances, more conveniently connected by a wirebond.

It should be noted that each unit 40 may also include additional electrically conductive regions for subsequently electrically connecting the corresponding OSA to a circuit board.

By way of example, as depicted in FIGS. 1b and 1d, if no device other than a single (two-terminal) optoelectronic device 110, such as an LED or PIN diode, is to be mounted on each unit 40 of a conductor pattern, then each unit 40 should include a first pair of contacts 50 and 60 (see FIG. 1d) and a second pair of contacts 70 and 80. A terminal 160 (see FIG. 1b) of optoelectronic device 110 is, for example, soldered to contact 60, while terminal 170 is, for example, wirebonded to contact 50. As shown in FIG. 1d, the contacts 50 and 60 are electrically connected to the contacts 70 and 80 by two strip-like conductors 90 and 100.

Figure 2:
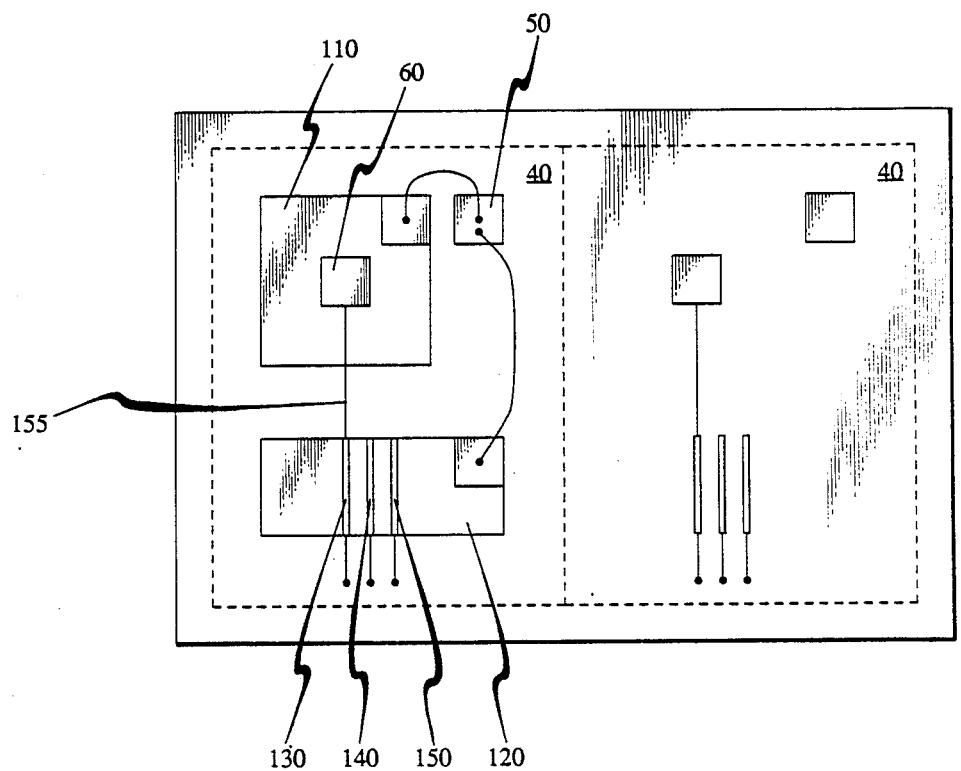
FIG. 2 is a schematic top view of a portion of a substrate having a metallization pattern formed on its surface in accordance with the inventive method.

As another example, FIG. 2 depicts two units 40 of a conductor pattern onto which a (two-terminal) optoelectronic device 110 (e.g., an LED) and, for example, a four-terminal electronic device 120 (e.g., a driver circuit for an LED) are to be mounted in electrical communication with each other. In this instance, one terminal of optoelectronic device 110 is soldered to contact 60 and the other terminal of optoelectronic device 110 is wirebonded to bonding pad 50. In addition, three of the four terminals of electronic device 120 are soldered to contacts 130, 140, and 150, while the fourth terminal is wirebonded to pad 50. As shown, contacts 60 and 130 are electrically connected via a strip-like conductor 155. Thus, optoelectronic device 110 electrically communicates with device 120 via contacts 50, 60, and 130, and strip-like conductor 155. In this instance, electrical communication is achieved using only three contacts (50, 60, and 130), rather than four, because bonding pad 50 serves, in effect, as two contacts.

As depicted in FIG. 1c, after the conductor pattern 30 has been formed, and after optoelectronic devices have been mounted on all units 40 of the conductor pattern, the substrate 10 is subdivided, e.g., by sawing or by laser scribing, to produce individual OSAs 175, which are incorporated into OAs. As a consequence, throughput is increased and unit costs reduced.

Significantly, in addition to achieving increased throughput and reduced unit costs, the inventive fabrication method is also advantageous because it yields reduced capacitance. That is, the electric conductors and electrical contacts associated with each OSA exhibit electrical capacitance, which is undesirable because it limits the speed of operation of, and/or reduces the signal-to-noise ratios of the signals transmitted to, the optoelectronic devices associated with the OSAs. This capacitance is determined by the dimensions of the electric conductors and contacts, by the dielectric constant of the substrate 10 (see FIGS. 1a–1d), and, if the substrate includes a layer 20 of electrically insulating material, the dielectric constant of this material. In this regard, the use of conventional metal deposition and lithographic patterning techniques in the inventive fabrication method permits the achievement of conductor dimensions which are smaller than those achieved using conventional silk-screen processing, and thus permits the achievement of substantial reductions in conductor capacitance. For example, if the substrate 10 is of silicon having an electrical resistivity of 0.001 ohm-cm, includes a layer 20 of, for example, silicon dioxide or polyimide, and the strip-like electric conductors are of metal, then the thickness of the conductors should range from about 1 to about 2 micrometers, the width of the conductors should be greater than 1 micrometer, and the length of the conductors should range as dictated by design constraints. Thicknesses less than about 1 micrometer are undesirable because there is not enough material to form a mechanically viable solder bond or wirebond, while thicknesses greater than about 2 micrometers are undesirable because at greater thicknesses it becomes impractical to form the conductors by vapor deposition, and a less preferred process, e.g., a plating process, must be used. Widths less than about 1 micrometer are undesirable because during photographic exposure of the resists, it may not be possible to simultaneously focus features finer than 1 micrometer in width on portions of the resist lying in different planes (e.g., where some portions of the resist to be exposed lie in an etched cavity or well). The maximum value of the conductor widths should be dictated by design constraints, including limits on the permissible amount of capacitance contributed by the conductors.

The electrical contacts connected to the strip-like electric conductors are preferably made of the same material, and are preferably the same thickness, as the electric conductors. If, for example, the electrical contacts are round, their diameter should range from about 100 to about 150 micrometers. Diameters less than about 100 micrometers are undesirable because they are smaller than assembly tolerances and they are too small to have sufficient mechanical strength for attachment by, e.g., solder joint or wirebonding, while diameters greater than 150 micrometers are undesirable because they contribute undesirable capacitance and inductance, and thus reduce the electrical performance.

Conductor capacitance is also readily reduced by increasing the thickness of the insulating layer 20 or by using substrates 10 of relatively high resistivity. Such a relatively high resistivity is achieved, for example, by using silicon substrates having relatively low dopant concentrations. For example, silicon substrates having relatively low dopant concentrations are readily used to make OSAs having capacitances less than 0.015 pf that are useful for optical communication at frequencies above 100 MHz. Alternatively, the use of, for example, 20-micrometer-thick polyimide layers also makes such high-frequency operation possible.

The use of relatively high-resistivity silicon is also very advantageous in relation to the problem of heat transport. That is, optically emissive devices, such as LEDs, often generate a significant amount of heat that must be absorbed and conducted away by the substrate 10. A thick insulating layer 20 between the LED and the silicon substrate can act as a thermally insulating barrier and prevent the effective removal of heat. In this case, it is desirable to use a relatively thin layer of silicon dioxide, i.e., a layer having a thickness less than about 0.5 micrometers, as the electrically insulating layer, and to reduce the capacitance of the OSA by using a relatively high resistivity silicon substrate.

In addition to achieving substantially reduced capacitance, the inventive fabrication method is also advantageous because it permits mass testing of the optoelectronic devices during the fabrication process, which also reduces unit costs. That is, as depicted in FIG. 1d, prior to subdividing the substrate 40 into individual OSAs, the conductor units 40 are readily interconnected, via strip-like conductors 180, lithographically fabricated from the same materials as the strip-like conductors 90 and 100, to form test circuits for simultaneously testing groups of opoelectronic devices mounted on conductor units. In this regard, the optoelectronic devices are tested by operating the devices, i.e., by applying an electric current or voltage between the end points 190 and 200 of a test circuit which includes the units 40 and connecting strip-like conductors 180. Then, while the optoelectronic devices are operating, a characteristic of device behavior indicative of proper/improper behavior is detected. For example, if the devices are LEDs, they are readily tested by detecting whether they are emitting light. If the devices are PIN diodes, they are usefully tested by measuring the voltage drop across each device. In either case, those devices that fail to operate properly are marked for rejection.

Testing is carried out either sequentially or simultaneously. In sequential testing, the optoelectronic devices are tested one at a time by a probe, e.g., an electrical probe or a discrete photodetector, that advances from one device to the next in sequence. In simultaneous testing, all of the optoelectronic devices in at least one test circuit are tested at once by an array comprising a multiplicity of probes. Alternatively, if the optoelectronic devices are LEDs, they are readily simultaneously tested by scanning the optical emission from the operating test circuit or circuits using an electronic imaging device such as a television camera.

If burning in of the devices is desired, the devices are operated, as described above, for a specified period of time and at an elevated temperature before they are tested. As a result, failure-prone devices are detected and eliminated.

Significantly, the test circuits, described above, are not only useful for mass-testing of the optoelectronic devices, but are also useful for simultaneously detecting short circuits in groups of conductor units. Such short circuits are detected, prior to mounting and testing of the optoelectronic devices, by, for example, measuring the capacitance between various points in the test circuit.

The electrical conductors 180 in the test circuits connecting the units 40 are not intended to be included in the final product. Accordingly, these connecting conductors are removed after the mass testing is completed by, for example, heating them with laser pulses such that they are vaporized. Alternatively, the connecting conductors are removed by cutting them away during the subdivision of the substrate. In such cases, these connecting conductors occupy regions of the substrate that are "sacrificial" in the sense that after the substrate is subdivided, the sacrificial regions have no optoelectronic devices mounted on them, and do not correspond to OSAs.

As noted, the conductor patterns are made lithographically. One advantage of lithographic patterning is that the relative orientation of any pair of points in the pattern is konwn very precisely. Where two or more masks are used, the relative orientation of any pair of points corresponding to different masks is also known very precisely and depends only on the initial orientations of the masks. Consequently, fiducial features, such as metallization patterns or etched features, are readily lithographically formed in the substrate, which are additional to the conductor pattern and bear a precise geometric relationship to it. These fiducial features, which are here termed "alignment features," are useful as guides for the proper positioning of the optoelectronic devices which are to be mounted on the substrate. Similarly, the alignment features are useful as guides for the proper positioning of lightwave channels such as optical connectors which are to be mounted on the substrate. In some instances, alignment features are lithographically formed on both major surfaces of the substrate. For example, an optoelectric device may be mounted on one surface, and an optical connector may be mounted on the other surface. Provided the masks for the two surfaces are properly aligned with each other, a fiber aligned with the alignment features on its mounting surface is assured of proper alignment with the active region of the optoelectronic device (which has been aligned with the alignment features on its own mounting surface).

Figure 3:
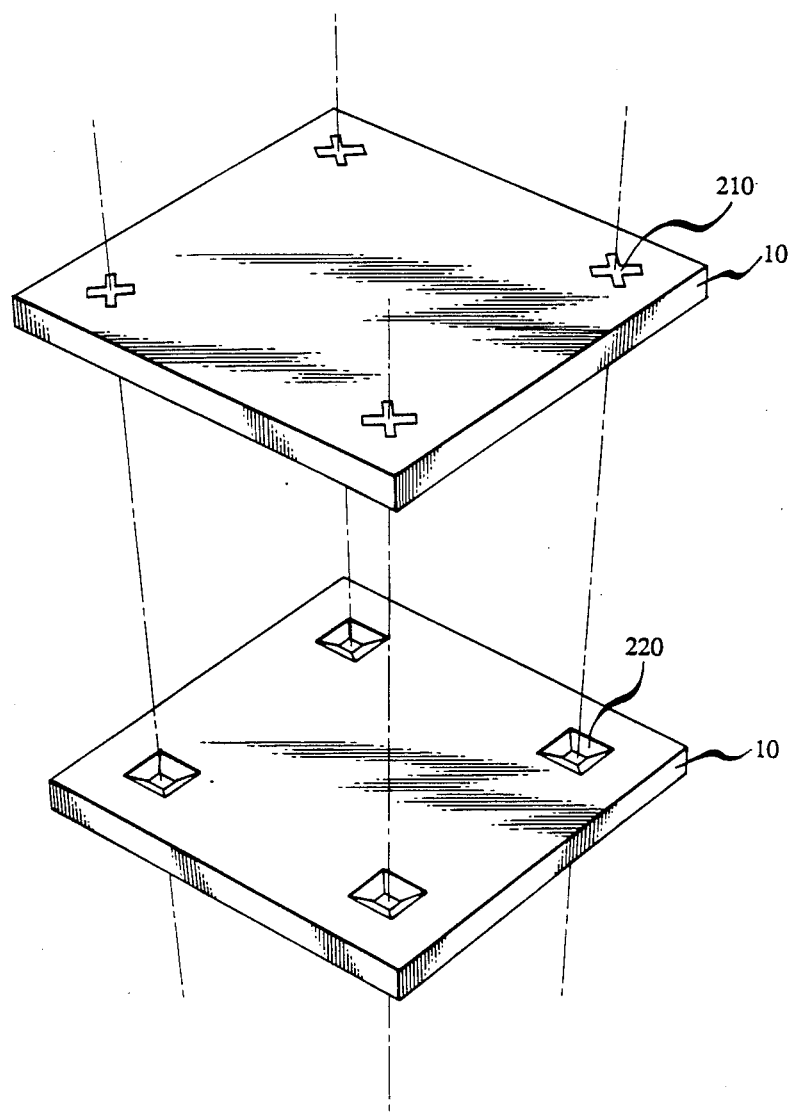
FIG. 3 is a perspective view of the top and bottom surfaces of a substrate which includes alignment features.

By way of example, FIG. 3 depicts metallized alignment features 210 on the upper surface of a substrate 10, and alignment features 220, in the form of etched cavities, on the lower surface of substrate 10, made using standard lithographic methods.

Cavities, grooves, and other such features, which are readily lithographically etched in substrate materials, such as silicon, can have structural, as well as fiducial functions. Multiple copies of such features are readily made simultaneously on a substrate surface. Because they are made lithographically, such features are readily formed in precise registry with the conductor pattern and with other etched and metallization features on the substrate, provided only that all of the masks are properly aligned. For example, a substrate is readily etched to form cavities extending from one major surface toward the other major surface. Cavities with, for example, sloping sides, are readily formed in an oriented substrate (for example, a [100] silicon substrate) by anisotropic crystallographic etching (that is, through the use of etchants that attack different crystal planes at different rates). A cavity with inward-sloping sides is formed, for example, by etching a [100] silicon substrate through a square or rectangular mask opening with a solution of potassium hydroxide dissolved in deionized water and propanol. This etchant preferentially etches the substrate to reveal [111] planes, which constitute the sloped walls of the cavities, with each such wall being inclined at an angle of 54.74 degrees relative to the exposed surface of the wafer. (An alternative etchant, which yields similar results but works more slowly, is ethylenediamine.)

By way of example, FIGS. 4a and 4b depict a portion of a silicon substrate 10 which has been crystallographically etched to form a cavity 230 with inward-sloping sides. The cavity extends from surface 240 toward surface 250. Cavities of this type, here called "capture cavities," are useful for accurately aligning the end of an optical fiber relative to an optoelectronic device mounted on the opposite surface of the substrate 10. That is, in use, the end of a fiber is inserted into the cavity, and the cavity walls direct the fiber into an alignment such that the end portion of the fiber is substantially perpendicular to surface 240 of the substrate and substantially centered within the cavity. (By substantially perpendicular is meant that the angle between the longitudinal axis of the fiber and the axis of the cavity is less than two degrees, and by substantially centered is meant that the longitudinal axis of the fiber is displaced from the axis of the cavity by less than 10 micrometers.) For multimode fibers, such alignment is often adequate for optical coupling of the fiber to an optoelectronic device even without any active alignment. The aligned fiber is readily fixed in position by filling the cavity around the fiber with an optical index-matched filler such as epoxy adhesive.

As another example, structurally useful grooves are readily formed in a substrate by conventional crystallographic etching techniques. With regard to utility, it is often desirable to support the end portion of an optical fiber in a position in which the fiber is substantially parallel to the surface of the substrate. By substantially parallel is meant that the longitudinal axis of the fiber is oriented less than 2 degrees above or below a plane parallel to the substrate surface. In this regard, a groove, e.g., a V-groove, is readily crystallographically etched into the substrate, and is usefully employed for supporting the end portion of an optical fiber in just such a position.

As a pedagogic aid to an even more complete understanding of the invention, the steps involved in applying the inventive method to the simultaneous fabrication of hundreds, or even thousands, of silicon OSAs having a particular configuration are described below.

Each OSA of the particular configuration comprises a silicon support member having a pair of cavities, of different sizes, etched in opposite major surfaces of the support member. An LED or PIN diode is mounted in the larger cavity, referred to as a "well". The smaller cavity, a "capture cavity," at least partially overlies the well. The capture cavity is adapted to receive the end of an optical fiber to be optically coupled to the LED or PIN diode.

With reference to FIGS. 5a-5h, a silicon wafer 10 (see FIG. 5a) is cut and polished into the form of a disc about 75 to 150 mm in diameter, with a thickness of about 0.55 mm (550 micrometers). The first major surface 240 and the second major surface 250 of the resulting disc are parallel to one another and lie in [100] crystal planes.

As described below, the wafer 10 is subjected to a lithographic patterning and etching process that results in the simultaneous formation, typically, of hundreds or even thousands of capture cavities extending from surface 240 toward surface 250. An equal number of sloping-sided wells extending from surface 250 toward surface 240 are readily simultaneously formed either in the same etching step, or in a prior or subsequent etching step.

Both the cavities and the wells typically extend about halfway through the wafer. Significantly, as noted above, each well overlies at least a portion of its corresponding cavity. Thus, optical transmission between each cavity and its corresponding well is achieved, for example, by extending the wells to meet the cavities such that each cavity is continuous with at least a portion of its corresponding well.

The lithographic patterning of wafer 10 begins with the formation of an electrically insulating, etch-resistant layer 470 (see FIG. 5b), exemplarily of silicon dioxide, about two micrometers thick, on each of surfaces 240 and 250. To form the capture cavities, a layer of conventional resist material 480 (see FIG. 5c) is applied to the entire first major surface 240. The resist layer is then lithographically patterned to define multiple, spaced-apart square openings, having dimensions of, for example, 503 micrometers by 503 micrometers, each square opening corresponding to one capture cavity (see FIG. 5d). Then, the patterned resist layer 490 is used as a mask for corresponding patterning, i.e., etching, the underlying oxide layer via, for example, plasma-assisted etching or a batch wet etching process using, e.g., buffered hydrofluoric acid as the etchant (see FIG. 5e). The patterned resist is then removed in a standard way, as depicted schematically in FIG. 5f. The wafer is then crystallographically etched, using the patterned oxide layer 500 as a mask, to produce the capture cavities 230, as depicted schematically in FIG. 5g. As noted above, a useful crystallographic etchant is potassium hydroxide dissolved in deionized water and propanol, which etches the wafer to reveal [111] planes that constitute the sloped walls of the cavities. As shown in FIG. 5h, each such wall is inclined at an angle $\theta$ of 54.74° relative to the first surface of the wafer. Silicon dioxide from the second surface that remains at the bottoms of the cavities is removed, for example, by plasma-assisted etching.

As noted, the wells (each of which overlies at least a portion of the corresponding cavity) are formed simultaneously with the cavities, or in an earlier or later sequential step. If, for example, the wells (not shown) are formed after forming the cavities, it is necessary to follow the cavity-etching step with the step of re-forming on the etched portions of surface 240 (i.e., the sides and bottoms of the capture cavities) an etch-resistant layer, exemplarily of silicon dioxide, in order to prevent further etching of that surface. A layer of resist is then applied to surface 250, and the patterning and etching process for forming the wells proceeds analogously to the formation of the capture cavities. The dimensions of the wells are typically 1.7 mm wide by 2.2 mm long.

Also readily formed in the same etching step as the capture cavities are optional rectangular cavities (not shown), formed by etching through mask openings adjacent and parallel to the sides of the mask openings through which the capture cavities are etched. The rectangular cavities will typically enhance the adhesion to surface 240 of epoxy or other substance used to mount the OSA when it is incorporated in an OA.

Because the chosen etching process constrains the sides of the cavity or well to make an angle of 54.74 degrees relative to the first surface, all the dimensions of the cavity or well are determined by the depth of the cavity or well and the size and shape of the mask opening through which the etchant attacks the silicon substrate. The depth of the cavity or well is determined by the length of time that the substrate is exposed to the etchant. If the mask opening for, e.g., a cavity, is square with edge length a, it is derivable from FIG. 6 that the relationship between edge length a, depth c, and edge length b at the bottom of the cavity, is expressed by:

$$b = a - (2c \cot \theta),$$

where $\theta$ equals 54.74 degrees.

Figure 6:
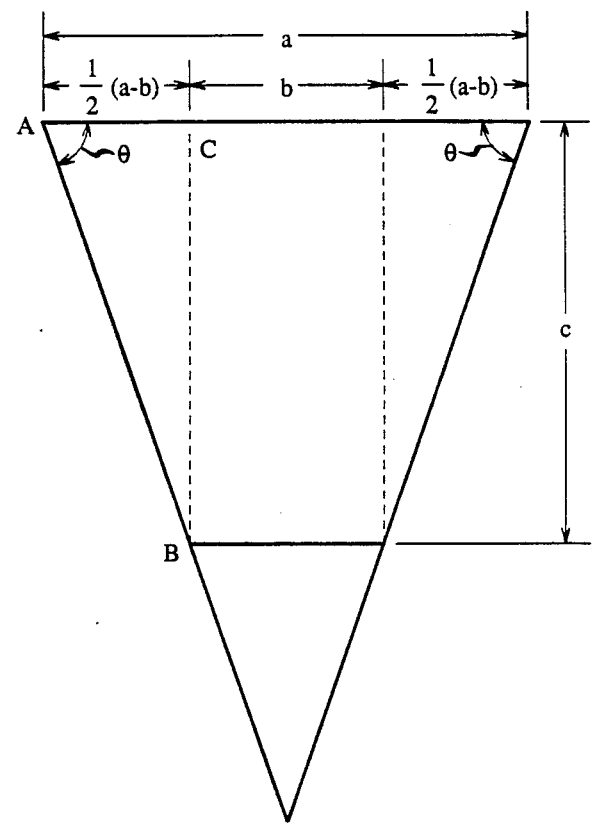
FIG. 6 illustrates the geometrical relationship between various cavity dimensions.

The above result is derived with reference to triangle ABC of FIG. 6. First, note that $\cot \theta = AC/BC$. Thus in terms of lengths a, b, and c, $\cot \theta = (\frac{1}{2})(a-b)/c$. Solving the last expression for b yields the desired result.

The outer diameters of conventional silica optical fibers range from about 125 micrometers to about 140 micrometers, while their core diameters range from about 8 micrometers to about 100 micrometers. To admit the inserted end of an optical fiber, the top of the capture cavity, that is, the opening of the cavity where it meets first major surface 240 (dimension "a" in FIG. 4), must be larger than the outer diameter of the fiber. It is desirable to choose the width of the bottom of the cavity (dimension "b" in FIG. 4) such that the fiber is stopped (i.e., makes tangential contact with the sides of the cavity) about 15 micrometers from the bottom of the cavity. However, it is also desirable for the width of the bottom of the cavity to be at least as large as the core diameter in order to maximize the amount of light transmitted through the bottom of the cavity to or from the fiber core.

In the case of the OSA to be described here, the optical fiber to which the OSA is to be optically coupled has an outer diameter of, for example, 125 micrometers and a core diameter of 62.5 micrometers. If dimension "b" is approximately 114 micrometers, then the end of the fiber is stopped approximately 8 micrometers from the bottom of the cavity. Because dimension "c" (i.e., the depth of the cavity) is about 225 micrometers (as noted above, the cavity extends about halfway through the substrate wafer), the corresponding value of dimension "a" (which is also equal to the size of the mask opening) is approximately 503 micrometers, as noted above. Where optical fibers of a different size are to be used, different values of "b," ranging from about 80 microns to about 140 microns, depending on the size of the optical fiber, and different corresponding values of "a" (which further depend on the depth of the cavity), are readily determined by analogy to the above example.

Figure 8:
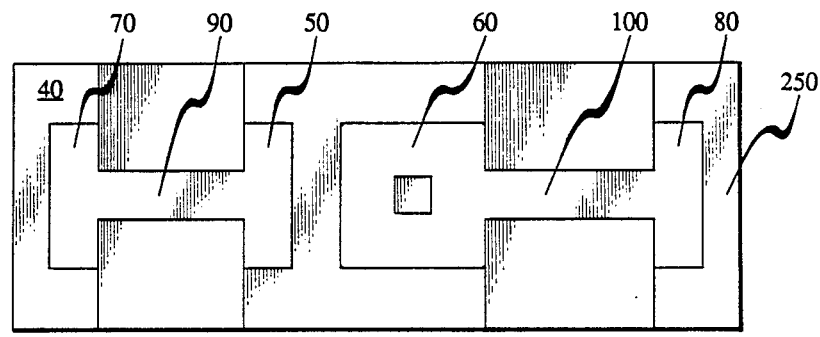
Figure 9:
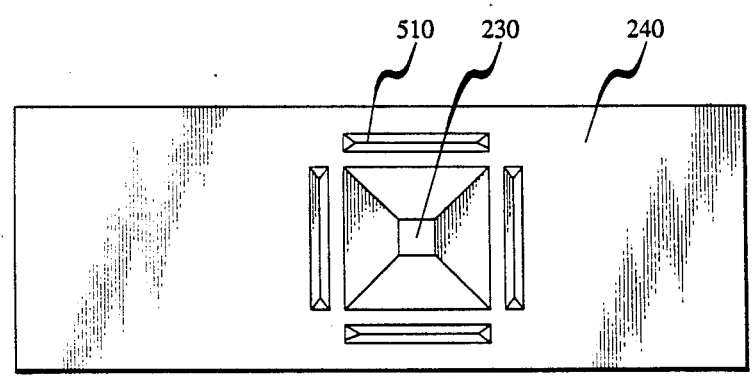

With reference to FIGS. 7-9, after the capture cavities 230 and optional adhesive-strength-enhancing rectangular cavities 510 are etched in first surface 240, and wells 520 are etched in second surface 250, an insulating layer (not shown), of, for example, silicon dioxide, is re-formed on the etched portions of second surface 250 (see FIG. 7). Next, a conductor pattern is formed on second surface 250 over the insulating layer by depositing one or more metallic layers on surface 250, and etching the layer or layers through a lithographically patterned resist. Each unit 40 of the resulting conductor pattern comprising an annular contact 60 (see FIG. 8), a bonding pad 50, strip-like conductors 90 and 100, and terminal contact regions 70 and 80. Because a portion of the conductor pattern, namely conductors 90 and 100, is formed on the sloping walls of well 520, the conductor pattern must be formed using a special, non-planar lithographic process. The process used involves $Ag_2 Se/Ge_x Se_{(1-x)}$ resist, and is described, for example, in E. Ong et al., SPIE Vol. 394, *Optical Microlithography II*, pp. 39-48, 1983, and U.S. Pat. No. 4,767,695 issued to Edith T. T. Ong, King L. Tai, and Yiu-Huen Wong on August 30, 1988, both incorporated herein by reference. Significantly, contact 60 and bonding pad 50 are formed on the flat bottom of well 520, and terminal contact regions 70 and 80 are formed on the unetched, flat, shoulder region 530 adjacent well 520. Contact 60, conductor 100, and terminal contact region 80 are continuous and electrically connected. Similarly, bonding pad 50, conductor 90, and terminal contact region 70 are continuous and electrically connected.

Also formed as part of the conductor pattern are strip-like connecting conductors (not shown), occupying sacrificial portions of the substrate, for connecting groups of units 40 of the conductor pattern in series test circuits. Each test circuit is further provided with test contacts (not shown). The test contacts are electrically connected to the test circuits such that when every unit in a test circuit has an optoelectronic device mounted on it, electric voltage applied between the test contacts causes electric current to flow through all of the optoelectronic devices in the test circuit.

Figure 10:
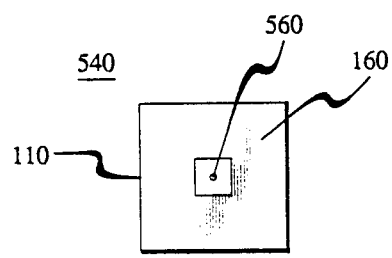
FIG. 10 is a front view of an optoelectronic device to be mounted in the well of FIG. 7.

An optoelectronic device 110 (see FIG. 10), to be mounted on contact 60 of conductor unit 40 (see FIG. 8), has a solder-coated electrical terminal 160 on its front face 540, and a metal terminal 170 on its back face 550 (see FIG. 7). Terminal 160 is annular, such that the metallized region of the terminal at least partially surrounds the active region 560 of device 110. (The active region is the portion of the front face of the optoelectronic device that emits or absorbs and detects light.) Significantly, annular contact 60, onto which terminal 160 of device 110 is to be mounted, is similar in shape and size to terminal 160. Moreover, contact 60 at least partially surrounds the square aperture 570 in the substrate defined by the intersection of the small end of the capture cavity with the bottom of well 520 (see FIG. 7).

Optoelectronic device 110 is affixed to the substrate by bringing terminal 160 into contact with contact 60 (see FIG. 8) and joining the contacting surfaces by conventional reflow soldering. During this step, terminal 160 is brought into substantially exact alignment with contact 60, with the result that the active region 560 of device 110 is essentially centered relative to aperture 570. (By "essentially centered" is meant centered to within 10 micrometers.) Back terminal 170 of device 110 is then wirebonded to bonding pad 50 (see FIG. 7).

It should be noted that terminal contacts 80 and 70 face upwardly (as viewed in FIG. 7) immediately after fabrication. When the corresponding OSA is mounted in an OA, terminal contacts 80 and 70 are rotated through 90 degrees so as to lie in the plane of the paper (as viewed in FIG. 7). However, it is often easier to make electrical connections to these contacts if the contacts face upwardly. In this regard, this is effectively achieved, in accordance with the invention, and as depicted in FIG. 7, through the use of a conductor block 580, which is a rectangular (in cross-section) block of insulating material, e.g., ceramic material, including metallic wraparound conductors 590 and 600 on its opposite ends. In use, faces 610 and 620 of the wraparound conductors are soldered, respectively, to terminal contacts 80 and 70. If contacts 80 and 70 are subsequently rotated to be in the plane of the paper, then, e.g., faces 623 and 626 of the wraparound conductors will face upwardly. The step of soldering the conductor blocks to the terminal contacts may take place either after, or, preferably, before, the step of separating the substrate wafer into parts.

After mounting of the optoelectronic devices, the test contacts are electrically connected to a source of electric current and voltage for mass burning in and testing. That is, the devices are operated for a predetermined time at an elevated temperature. Then, the devices are tested. For example, if the devices are LEDs, the active region 560 (see FIG. 10) of each device is probed by an optical detector to determine whether it is emitting light. Those LEDs that fail to emit light are marked for rejection with a spot of ink.

After mass testing, the substrate is removed from the test apparatus. After removal, the optoelectronic devices and their corresponding units of the conductor pattern are readily individually encapsulated using, e.g., conventional means. Then, the substrate is separated by conventional means into parts, at least some of which correspond to individual OSAs. Exemplary dimensions for the support member (i.e., that portion of the substrate that corresponds to an individual OSA) are 0.55 mm thick (the thickness of the initial silicon substrate), 2.2 mm wide, and 2.7 mm long. In this separation process, the sacrificial regions are removed.

Figure 11:
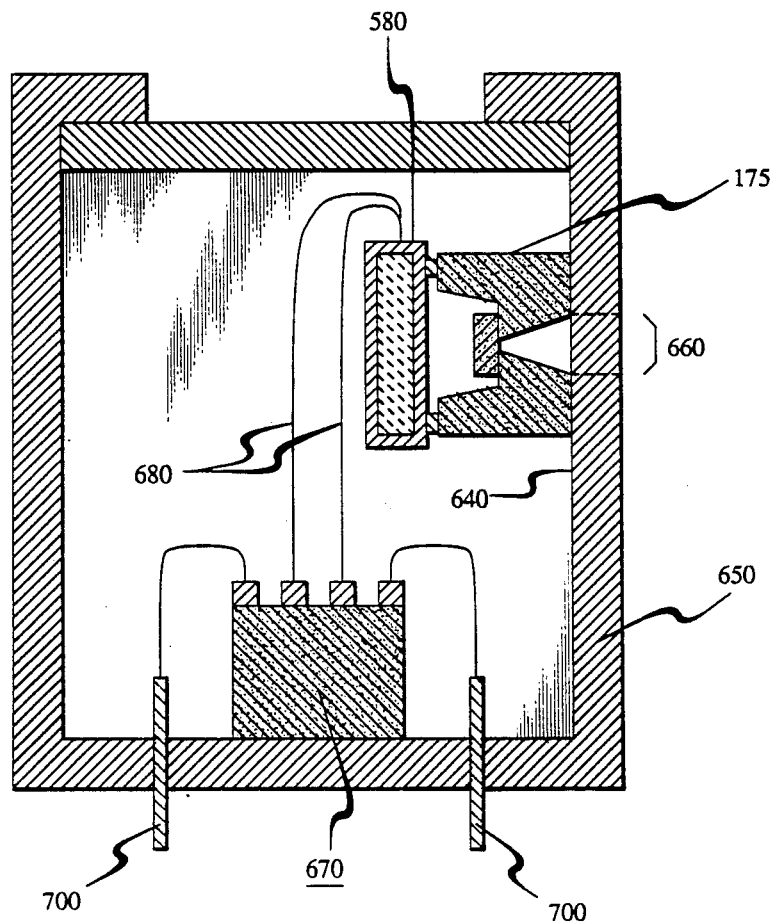
FIG. 11 is a schematic cross-sectional view of an OA comprising an OSA incorporated into a housing.

Significantly, in accordance with the invention, OAs are readily manufactured in the form of VLSI packages. Each such OA is adapted to be mounted on a planar electronic array, such as a circuit board, via contact pins. Each such OA is also adapted for connection to an optical fiber. That is, as depicted in FIG. 11, such an OA is formed by mounting an OSA 175 on the inner surface 640 of housing 650, adjacent aperture 660 in the housing. One or more integrated circuits 670 are also mounted within the housing. At least one integrated circuit is electrically connected to the optoelectronic device via wirebonds 680 and conductor block 580. Wirebonds 680 extend from contacts on integrated circuit 670 to the wraparound conductors on conductor block 580. The circuitry within the housing is electrically connected to contact pins 700, extending through the wall of the housing, in order to make contact to devices external to the housing. The end portion of, for example, an optical fiber is inserted through aperture 660 and fixed within the capture cavity of OSA 175.

We claim:

1. A method of manufacturing at least two articles, comprising the steps of:

providing a substrate having first and second surfaces;

forming, on said second surface, at least first and second sets of electrically conductive regions, each of said sets including at least two electrical contacts and at least one electric conductor electrically connecting said two electrical contacts;

mounting at least first and second optoelectronic devices on the second surface of said substrate, so that each optoelectronic device is in electrical contact with one of said sets of conductive regions;

after said mounting step, dividing said substrate into at least first and second parts, each of said parts including one of said sets of conductive regions and one of said optoelectronic devices; and completing the manufacture of said articles,

CHARACTERIZED IN THAT the method further comprises, prior to said dividing step, the step of forming, in said first surface, at least first and second cavities extending from said first surface toward said second surface, and wherein said dividing step leads to each of said parts including one of said cavities.

2. The method of claim 1, wherein said completing step comprises inserting an end portion of a lightwave channel into one of said cavities.

3. A method of manufacturing at least two articles, comprising the steps of:

providing a substrate having first and second surfaces;

forming, on said second surface, at least first and second sets of electrically conductive regions, each of said sets including at least two electrical contacts and at least one electric conductor electrically connecting said two electrical contacts;

mounting at least first and second optoelectronic devices on the second surface of said substrate, so that each optoelectronic device is in electrical contact with one of said sets of conductive regions;

after said mounting step, dividing said substrate into at least first and second parts, each of said parts including one of said sets of conductive regions and one of said optoelectronic devices; and completing the manufacture of said articles,

CHARACTERIZED IN THAT the method further comprises, prior to said dividing step, the step of forming, in said first surface, at least first and second grooves extending from said first surface toward said second surface, each of said grooves being capable of receiving at least an end portion of an optical fiber oriented substantially parallel to said first surface.

4. The method of claim 3, wherein said completing step includes the step of inserting an end portion of an optical fiber into of said grooves.

5. The method of claim 1, further comprising, prior to said dividing step, the step of forming, in said second surface, at least first and second wells extending from said second surface toward said first surface, each of said wells overlying at least a portion of one of said cavities, and wherein said mounting step comprises mounting said first and second optoelectronic devices in said first and second wells.

6. The method of claim 5, wherein said well-forming step includes the step of extending said first and second wells to, respectively, said first and second cavities, whereby at least a portion of each of said wells is continuous with at least a portion of one of said cavities.

7. The method of claim 6, further comprising, prior to said dividing step, the step of mounting on said substrate at least first and second conductor blocks, each of said conductor blocks being in electrical contact with one of said optoelectronic devices.

8. The method of claim 6, further comprising, subsequent to said dividing step, the step of mounting on each of said parts a conductor block in electrical contact with one of said optoelectroic devices.

9. A method of manufacturing at least two optical assemblies, comprising the steps of:

providing a substrate having first and second surfaces;

forming, on said second surface, at least first and second sets of electrically conductive regions, each of said sets including at least two electrical contacts and at least one electric conductor electrically connecting said two electrical contacts;

mounting at least first and second optoelectronic devices on said second surface, so that each optoelectronic device is in electrical contact with one of said sets of conductive regions; and after said mounting step, dividing said substrate into at least first and second parts, each of said parts including one of said sets of conductive regions and one of said optoelectronic devices,

CHARACTERIZED IN THAT the method further comprises:

prior to said dividing step, the steps of forming, in said first surface, at least first and second cavities extending from said first surface toward said second surface such that said dividing step leads to each of said parts including one of said cavities; and forming, in said second surface, at least first and second wells extending from said second surface toward said first surface, each of said wells overlying and continuous with at least a portion of one of said cavities, said mounting step comprising mounting said first and second optoelectronic devices in said first and second wells;

and after said dividing step, the step of incorporating each of said parts, and at least one electronic circuit in electrical contact with each of said parts, into a housing.

* * * * *

UNITED STATES PATENT AND TRADEMARK OFFICE
CERTIFICATE OF CORRECTION

PATENT NO. : 4,926,545

DATED : May 22, 1990

INVENTOR(S) : Richard J. Pimpinella and John M. Segelken

It is certified that error appears in the above-identified patent and that said Letters Patent is hereby corrected as shown below:

column 2, line 56, "suffer undesir-" should read --suffer from undesir- --. Column 3, line 14, "individual members" should read --individual support members--. Column 11, line 48, "(1/4)" should read --(1/2)--.

In the claims, column 15, line 5, "into of said" should read --into one of said--.

Signed and Sealed this

Seventeenth Day of December, 1991

Attest:

HARRY F. MANBECK, JR.

*Attesting Officer*  *Commissioner of Patents and Trademarks*